United States Patent [19]
Yamasaki et al.

[11] Patent Number: 5,789,808
[45] Date of Patent: Aug. 4, 1998

[54] SEMICONDUCTOR DEVICE STRUCTURED TO BE LESS SUSCEPTIBLE TO POWER SUPPLY NOISE

[75] Inventors: Kyoji Yamasaki; Mikio Asakura; Tadaaki Yamauchi, all of Hyogo, Japan

[73] Assignee: Mitsubishi Denki Kabushiki Kaisha, Tokyo, Japan

[21] Appl. No.: 760,008

[22] Filed: Dec. 3, 1996

[30] Foreign Application Priority Data

May 30, 1996 [JP] Japan ..................... 8-136945

[51] Int. Cl.$^6$ ..................................... H01L 23/48
[52] U.S. Cl. ................. 257/693; 257/665; 257/734; 327/540
[58] Field of Search ..................... 257/693, 734, 257/784, 786, 665, 355, 503; 365/189.01, 189.09, 189.11; 327/540, 538, 541

[56] References Cited

FOREIGN PATENT DOCUMENTS

| | | |
|---|---|---|
| 4-260341 | 9/1992 | Japan . |
| 5-174578 | 7/1993 | Japan . |
| 7-297188 | 11/1995 | Japan . |

Primary Examiner—Tom Thomas
Assistant Examiner—Roy Potter
Attorney, Agent, or Firm—McDermott, Will & Emery

[57] ABSTRACT

A lead frame of a DRAM chip includes a base end portion to which an external power supply potential ext•VCC is applied, and two branch portions branching away from the base end portion. A tip portion of one of these two branch portions is connected to an output buffer, and a tip portion of the other is connected to another circuit. Power supply noise generated at the output buffer passes through one of the branch portions to the outside, and will never reach another circuit through the other branch portion. Accordingly, a DRAM which is less susceptible to power supply noise can be provided.

1 Claim, 10 Drawing Sheets

SEMICONDUCTOR DEVICE STRUCTURED TO BE LESS SUSCEPTIBLE TO POWER SUPPLY NOISE

BACKGROUND OF THE INVENTION

1. Field of the Invention

The present invention relates to a semiconductor device, and more particularly, to a semiconductor device having an internal circuit responsive to an external signal for carrying out a predetermined operation and a semiconductor device formed on a semiconductor substrate.

2. Description of the Background Art

Figure 6:
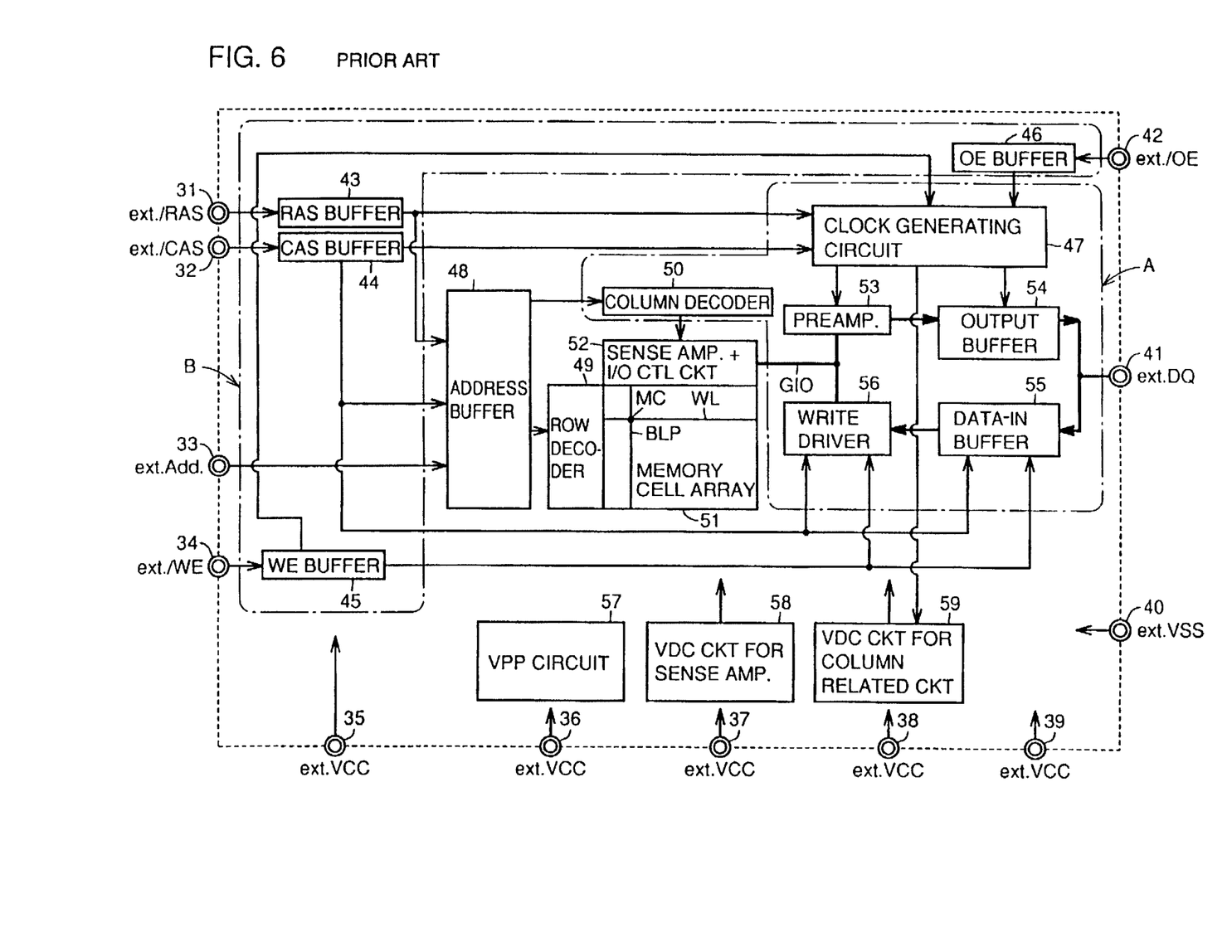
FIG. 6 is a circuit block diagram showing a structure of a conventional DRAM.

FIG. 6 is a block diagram showing a structure of a conventional dynamic random access memory (hereinafter referred to as DRAM). Referring to FIG. 6, this DRAM includes control signal input terminals 31, 32, 34 and 42, an address signal input terminal 33, a data signal input/output (I/O) terminal 41, power supply terminals 35 to 39, and a ground terminal 40. The DRAM further includes an RAS buffer 43, a CAS buffer 44, a WE buffer 45, an OE buffer 46, a clock generating circuit 47, an address buffer 48, a row decoder 49, a column decoder 50, a memory cell array 51, and a sense amplifier +I/O control circuit 52. The DRAM further includes a preamplifier 53, an output buffer 54, a data-in buffer 55, a write driver 56, a VPP circuit 57, a VDC circuit 58 for sense amplifier, and a VDC circuit 59 for column-related circuit.

Buffers 43 to 46 generates internal control signals in response to external control signals ext•/RAS, ext•/CAS, ext•/WE and ext•/OE applied through control signal input terminals 31, 32, 34 and 42, respectively. Clock generating circuit 47 selects a prescribed operation mode based on the respective internal control signals applied from buffers 43 to 46 to control the entire DRAM.

Address buffer 48 generates an internal address signal in response to an external address signal ext•Add•applied through address signal input terminal 33, and selectively applies the internal address signal to row decoder 49 and column decoder 50. Memory cell array 51 includes a plurality of memory cells MCs arranged in a matrix in row and column directions, a word line WL provided corresponding to each row, and a bit line pair BLP provided corresponding to each column.

Row decoder 49 selects any one word line WL from memory cell array 51 in response to the internal address signal applied from address buffer 48. A boosted potential VPP is applied to the selected word line WL, whereby a memory cell MC corresponding to that word line WL is activated. Column decoder 50 selects any one bit line pair BLP from memory cell array 51 in response to the internal address signal applied from address buffer 48. Sense amplifier+I/O control circuit 52 connects the bit line pair BLP selected by column decoder 50 to one end of a global signal I/O line pair GIO. More specifically, a memory cell MC located at an intersection of the word line WL selected by row decoder 49 and the bit line pair BLP selected by column decoder 50 is connected to one end of the global signal I/O line pair GIO.

The other end of the global signal I/O line pair GIO is connected to preamplifier 53 and write driver 56. In read operation, preamplifier 53 and output buffer 54 amplifies data read from the selected memory cell MC and outputs the resultant data to data signal I/O terminal 41. In write operation, data-in buffer 55 and write driver 56 applies data externally applied through data signal I/O terminal 41 to the selected memory cell MC through the global signal I/O line pair GIO.

An external power supply potential ext•VCC applied through power supply terminal 35 is applied to buffers 43 to 46 (shown as a portion B in the figure). VPP circuit 57 boosts an external power supply potential ext•VCC applied through power supply terminal 36 to produce a boosted potential VPP for word line WL. VDC circuit 58 down-converts an external power supply potential ext•VCC applied through power supply terminal 37 to produce an internal power supply potential int•VCC and applies the internal power supply potential int•VCC to sense amplifier+I/O control circuit 52. VDC circuit 59 down-converts an external power supply potential ext•VCC applied through power supply terminal 38 to produce an internal power supply potential int•VCC and applies the internal power supply potential int•VCC to the column-related circuit (shown as a portion A in the figure). An external power supply potential ext•VCC applied through power supply terminal 39 is applied to output buffer 54. An external ground potential ext•VSS applied through ground terminal 40 is applied to the entire DRAM.

Figure 7:
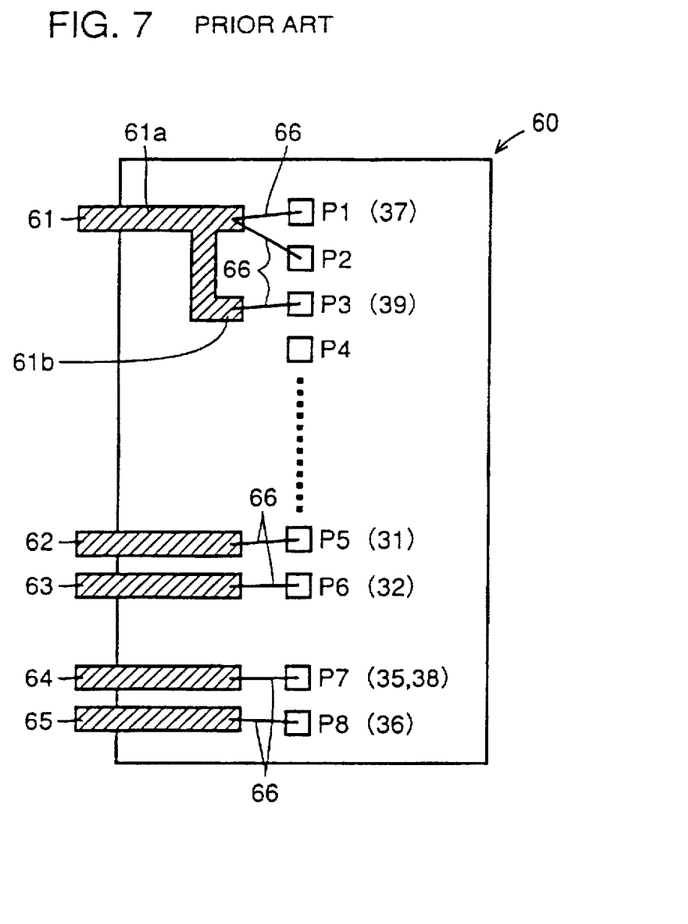
FIG. 7 is a plan view showing a structure of a DRAM chip including the DRAM shown in FIG. 6, wherein illustration of some components is omitted.

FIG. 7 is a plan view showing a structure of a DRAM chip 60 integrated in a package, wherein illustration of some components is omitted.

In FIG. 7, the DRAM of FIG. 6 is formed at a surface of DRAM chip 60. A plurality of pads (only pads P1 to P8 are shown in the figure) are arranged in the middle of the surface of DRAM chip 60. Pads P1, P3 and P8 constitute power supply terminals 37, 39 and 36 of FIG. 6, respectively. Pads P5 and P6 constitute control signal input terminals 31 and 32 of FIG. 6, respectively. Pad 7 constitute power supply terminals 35 and 38 of FIG. 6.

A plurality of lead frames (only lead frames 61 to 65 are shown in the figure) are located above DRAM chip 60. Lead frame 61 includes a base portion 61a and a branch portion 61b branching away from a tip portion of base portion 61a. A base end portion of base portion 61a is connected to a pin of a package which is not shown, and the tip portion is connected to pads P1 and P2 through bonding wires 66. A tip portion of branch portion 61b is connected to pad P3 through a bonding wire 66. Base end portions of lead frames 62 to 65 are connected to pins of the package which is not shown, and tip portions thereof are connected to pads P5 to P8 by bonding wires 66, respectively. An external power supply potential ext•VCC and an external control signal are applied to the DRAM through lead frames 61 to 65, bonding wires 66 and pads P1 to P8.

Figure 8:
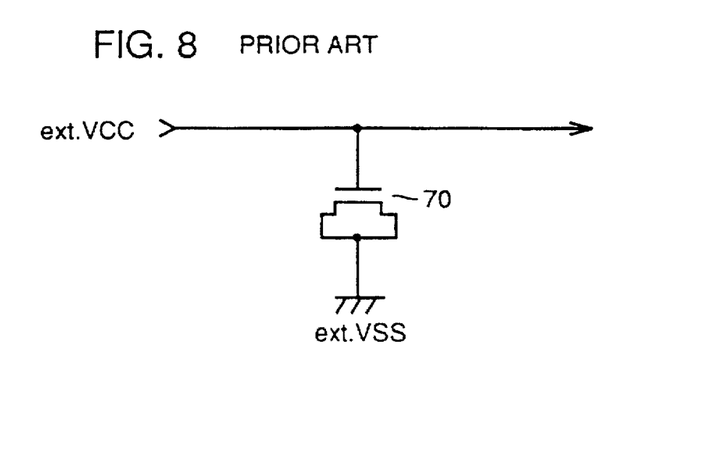
FIG. 8 is a circuit diagram showing a capacitor constituted by an n channel MOS transistor 70 included in the DRAM chip shown in FIG. 7.

A noise removing capacitor constituted by an n channel MOS transistor 70 is provided between an external power supply potential ext•VCC line and an external ground potential ext•VSS line of the DRAM, as shown in FIG. 8. The n channel MOS transistor 70 has its gate connected to the external power supply potential ext•VCC line, and its source and drain connected in common to the external ground potential ext•VSS line.

Figure 9A:
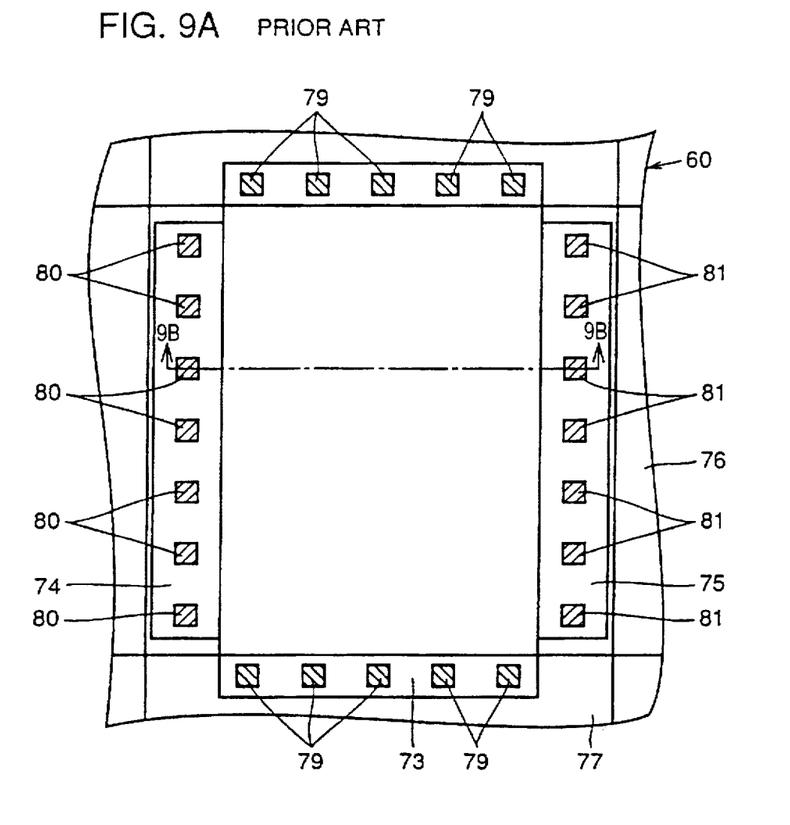
FIG. 9A is a fragmentary plan view showing a structure of a portion including the capacitor constituted by n channel MOS transistor 70 in the DRAM chip shown in FIG. 7.
Figure 9B:
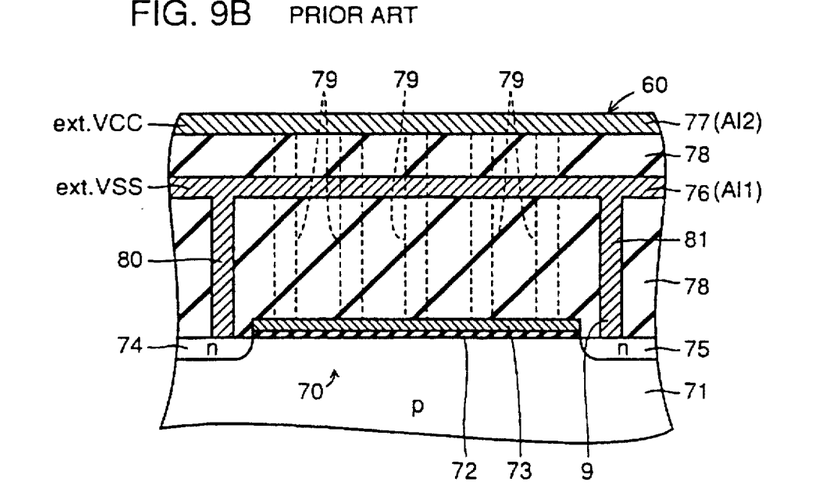
FIG. 9B is a cross sectional view taken along the line 9B—9B of FIG. 9A.

FIG. 9A is a fragmentary plan view showing a structure of a portion including n channel MOS transistor 70 in DRAM chip 60, and FIG. 9B is a cross sectional view taken along the line 9B—9B of FIG. 9A. Referring to FIGS. 9A and 9B, a gate electrode 73 is formed on a surface of a p type silicon substrate 71 of DRAM chip 60 with a gate oxide film 72 interposed therebetween. An n type source region 74 is formed on one side of gate electrode 73, and an n type drain region 75 is formed on the other side thereof, so that n channel MOS transistor 70 is formed.

An external ground potential ext•VSS line 76 is provided above the surface of silicon substrate 71 with an insulating layer 78 interposed therebetween, and an external power supply potential ext•VCC line 77 is further provided above external ground potential ext•VSS line 76 with insulating layer 78 therebetween. External ground potential ext•VSS line 76 is formed of a first aluminum interconnection layer (AR1), and external power supply potential ext•VCC line 77 is formed of a second aluminum interconnection layer (AR2). External power supply potential ext•VCC line 77 is connected to gate electrode 73 of n channel MOS transistor 70 through a contact hole 79, and external ground potential ext•VSS line 76 is connected to source region 74 and drain region 75 of n channel MOS transistor 70 through respective contact holes 80 and 81.

Since an external power supply potential ext•VCC is applied to gate electrode 73 of n channel MOS transistor 70 and an external ground potential ext•VSS is applied to source region 74 and drain region 75 thereof, a channel is formed in a region under gate oxide film 72 at the surface of p type silicon substrate 71, and a capacitor is formed between gate electrode 73 and the channel.

Figure 10:
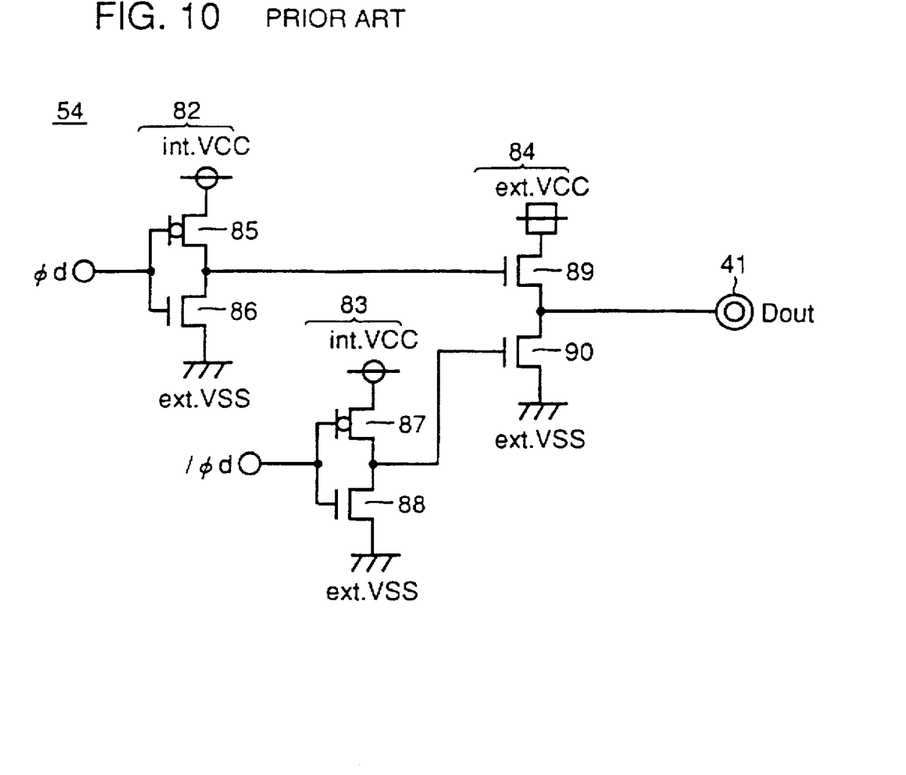
FIG. 10 is a circuit diagram showing a structure of an output buffer 54 shown in FIG. 6.

FIG. 10 is a circuit diagram showing a structure of output buffer 54 of FIG. 6. Referring to FIG. 10, this output buffer 54 includes two inverters 82 and 83 and an output circuit 84. Inverter 82 includes a p channel MOS transistor 85 and an n channel MOS transistor 86 which are connected in series between an internal power supply potential int•VCC line and an external ground potential ext•VSS line, and produces an inverted signal /Nd of an internal data signal Nd output from preamplifier 53. Inverter 83 includes a p channel MOS transistor 87 and an n channel MOS transistor 88 which are connected in series between the internal power supply potential ext•VCC line and the external ground potential ext•VSS line, and produces an inverted signal Nd of an internal data signal/Nd output from preamplifier 53.

Output circuit 84 includes two n channel MOS transistors 89 and 90. The n channel MOS transistor 89 is connected between an external power supply potential ext•VCC line and data signal I/O terminal 41, and receives an output of inverter 82 at its gate. The n channel MOS transistor 90 is connected between data signal I/O terminal 41 and the external ground potential ext•VSS line, and receives an output of inverter 83 at its gate.

When the internal data signal Nd is at an "H" level, inverters 82 and 83 output signals at an "L" level and an "H" level, respectively, and n channel MOS transistor 89 is rendered non-conductive and n channel MOS transistor 90 is rendered conductive, so that data signal I/O terminal 41 falls to an "L" level. Furthermore, when the internal data signal Nd is at an "L" level, inverters 82 and 83 output signals at an "H" level and an "L" level, respectively, and n channel MOS transistor 89 is rendered conductive and n channel MOS transistor 90 is rendered non-conductive, so that data signal I/O terminal 41 attains an "H" level.

Figure 11:
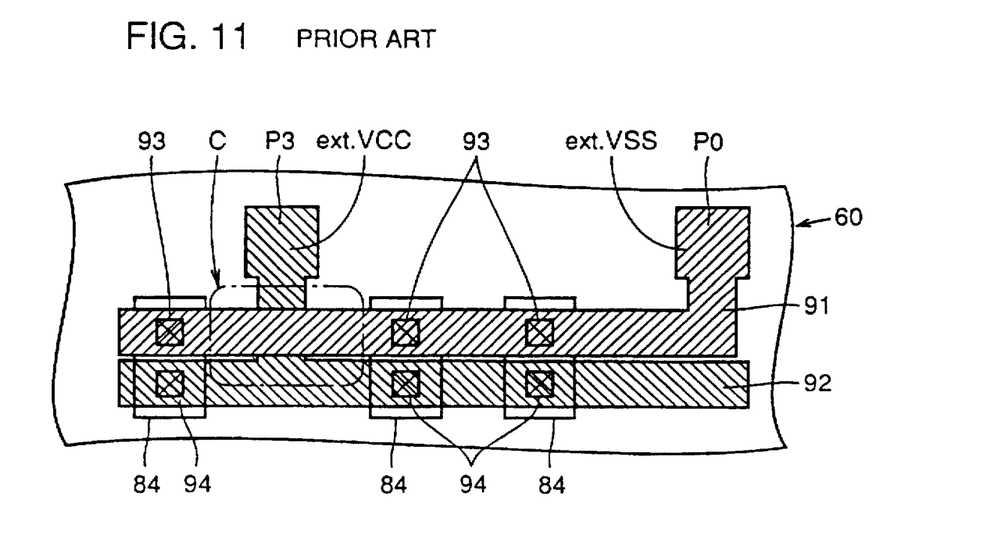
FIG. 11 is a fragmentary plan view showing a structure of a portion including an output circuit 84 in the DRAM chip shown in FIG. 7.

FIG. 11 is a fragmentary plan view showing a structure of a portion including output circuit 84 in DRAM chip 60. Referring to FIG. 11, a plurality (three in the figure) of output circuits 84 are provided at the surface of DRAM chip 60. An external ground potential ext•VSS line 91 and an external power supply potential ext•VCC line 92 are located above the plurality of output circuits 84. The external ground potential ext•VSS line is connected to each output circuit 84 through a contact hole 93. The external power supply potential ext•VCC line is connected to each output circuit 84 through a contact hole 94. External ground potential ext•VSS line 91 has its one end connected to a pad P0, which in turn receives an external ground potential ext•VSS. External power supply potential ext•VCC line 92 extends under external ground potential ext•VSS line 91 and then is connected to a pad P3.

Figure 12A:
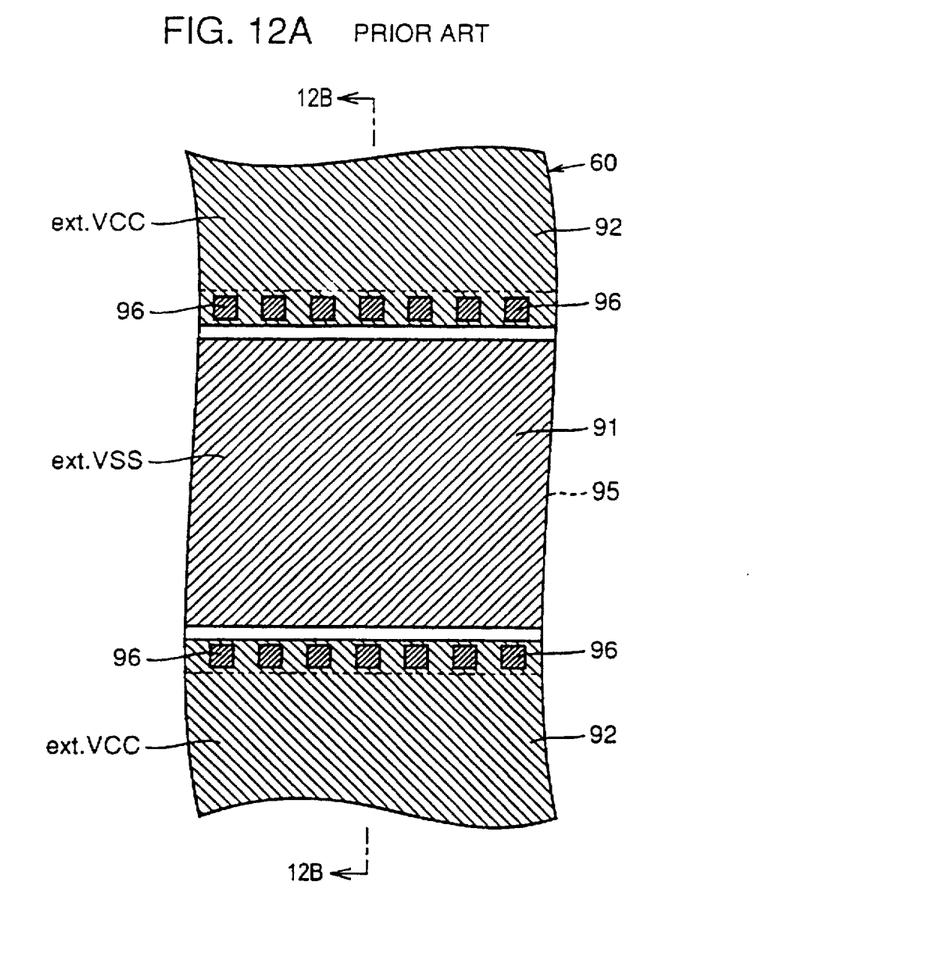
FIG. 12A is a fragmentary enlarged view showing a structure of a cross under portion shown in FIG. 11.
Figure 12B:
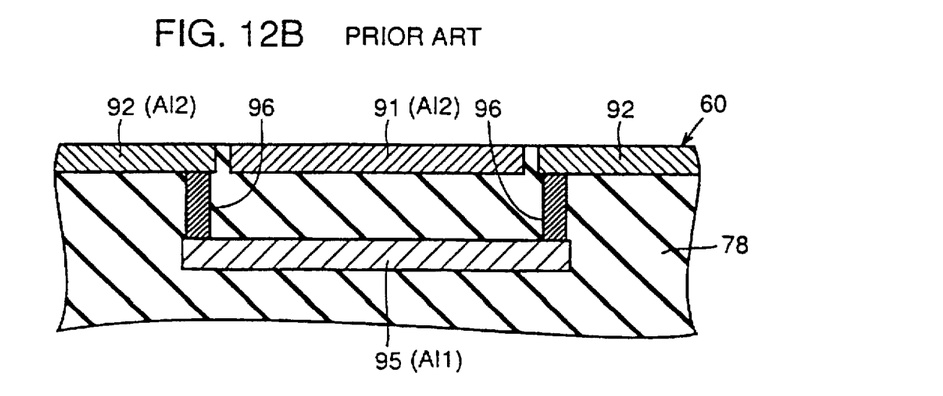
FIG. 12B is a cross sectional view taken along the line 12B 12B of FIG. 12A.

FIG. 12A is an enlarged view showing a structure of a cross under portion (shown as a portion C in the figure) of FIG. 11, and FIG. 12B is a cross sectional view taken along the line 12B—12B of FIG. 12A. External ground potential ext•VSS line 91 and external power supply potential ext•VCC line 92 are formed of a second aluminum interconnection layer (AR2). A connection electrode 95 having a width larger than that of external ground potential ext•VSS line 91 is formed of a first aluminum interconnection layer (AR1) under external ground potential ext•VSS line 91, and both ends of connection electrode 95 are connected to external power supply potential ext•VCC line 92 through respective contact holes 96.

Figure 13:
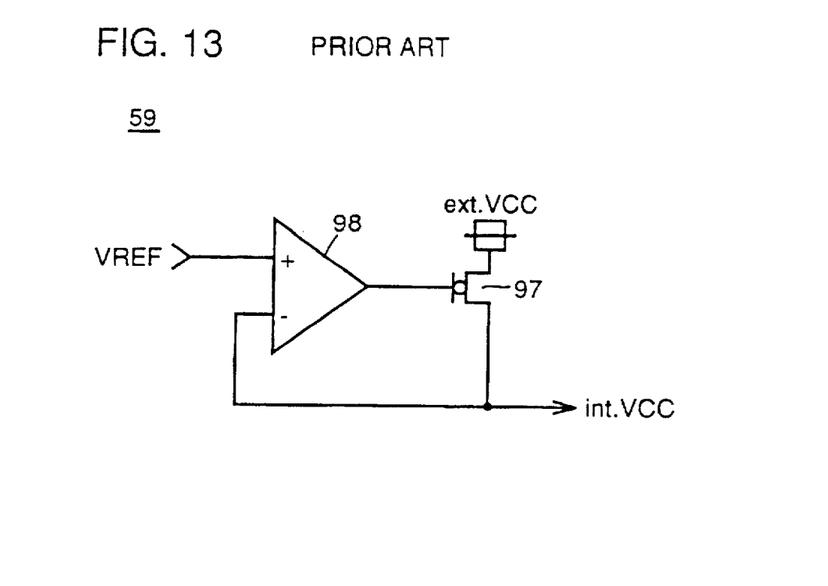
FIG. 13 is a circuit diagram showing a structure of a VDC circuit 59 shown in FIG. 6.

FIG. 13 is a circuit diagram showing a structure of VDC circuit 59. Referring to FIG. 13, this VDC circuit 59 includes a p channel MOS transistor 97 and an operational amplifier 98. The p channel MOS transistor 97 is connected between an external power supply potential ext•VCC line and an internal power supply potential int•VCC line, and receives an output of operational amplifier 98 at its gate. A non-inverting input terminal of operational amplifier 98 receives a reference potential VREF (VREF<VCC), and an inverting input terminal thereof is connected to the internal power supply potential int•VCC line. Operational amplifier 98 controls a gate potential of p channel MOS transistor 97 so that the internal power supply potential int•VCC matches the reference potential VREF.

Figure 14:
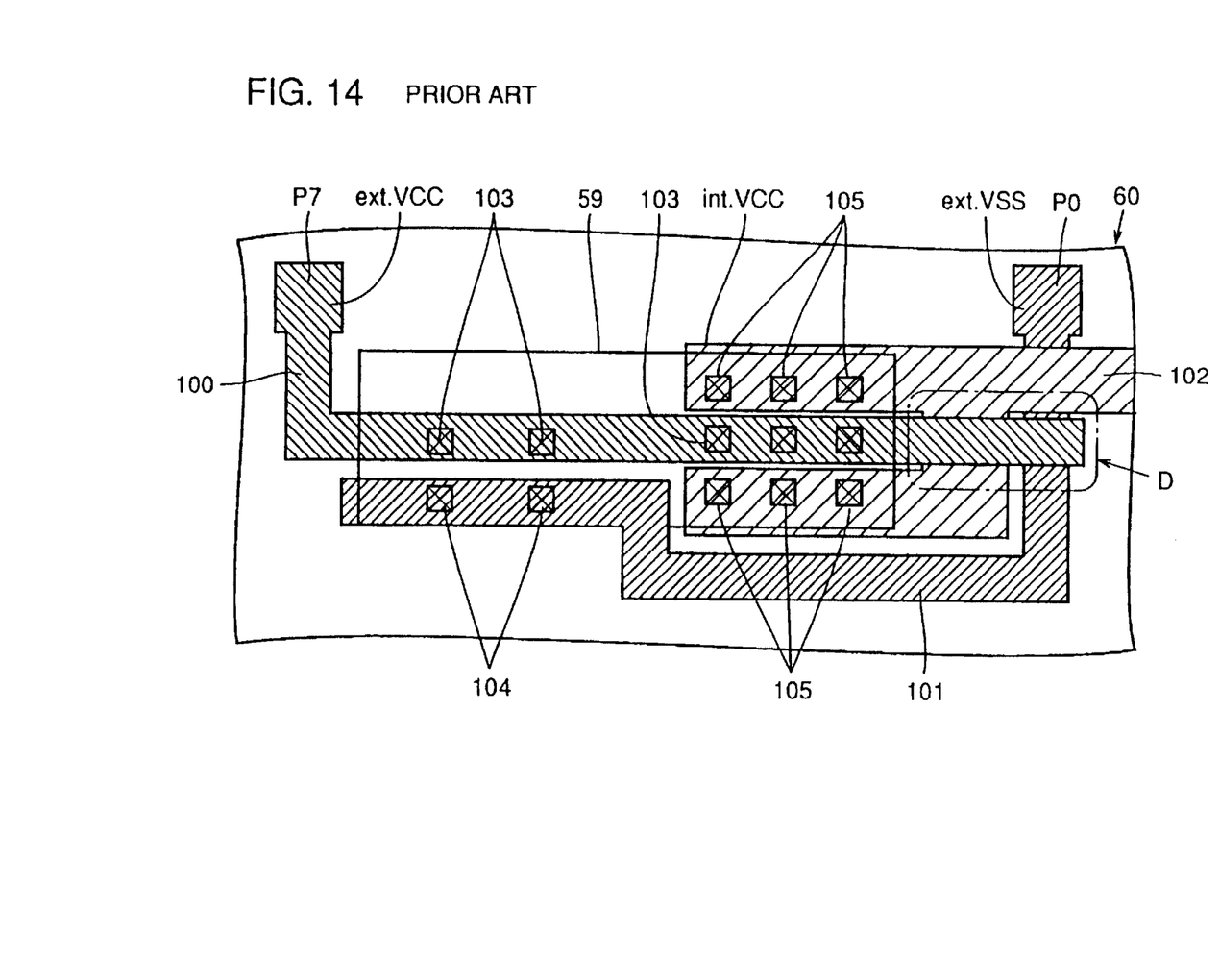
FIG. 14 is a fragmentary plan view showing a structure of a portion including VDC circuit 59 in the DRAM chip shown in FIG. 7.

FIG. 14 is a fragmentary plan view showing a structure of a portion including VDC circuit 59 in DRAM chip 60.

Referring to FIG. 14, VDC circuit 59 is provided at the surface of DRAM chip 60. An external power supply potential ext•VCC line 100, an external ground potential ext•VSS line 101 and an internal power supply potential int•VCC line 102 are located above VDC circuit 59. External power supply potential ext•VCC line 100, external ground potential ext•VSS line 101 and internal power supply potential int•VCC line 102 are connected to VDC circuit 59 through respective contact holes 103, 104 and 105. External power supply potential ext•VCC line 100 has its one end connected to a pad P7. External power supply potential ext•VCC line 100 and internal power supply potential int•VCC line 102 intersect each other. External ground potential ext•VSS line 101 extends under lines 100 and 102 and then is connected to a pad P0.

Since the conventional DRAM has been structured as such, there have been the following problems.

First, when the internal data signals Nd and /Nd switch in FIG. 10, both n channel MOS transistors 89 and 90 in output circuit 84 are rendered conductive and a potential at pad P3 is reduced temporarily. This temporary reduction in potential is transmitted as power supply noise from pad P3 through lead frame 61 to other pads P1 and P2 of FIG. 7, causing malfunction of VDC circuit 58 or the like.

Figure 15:
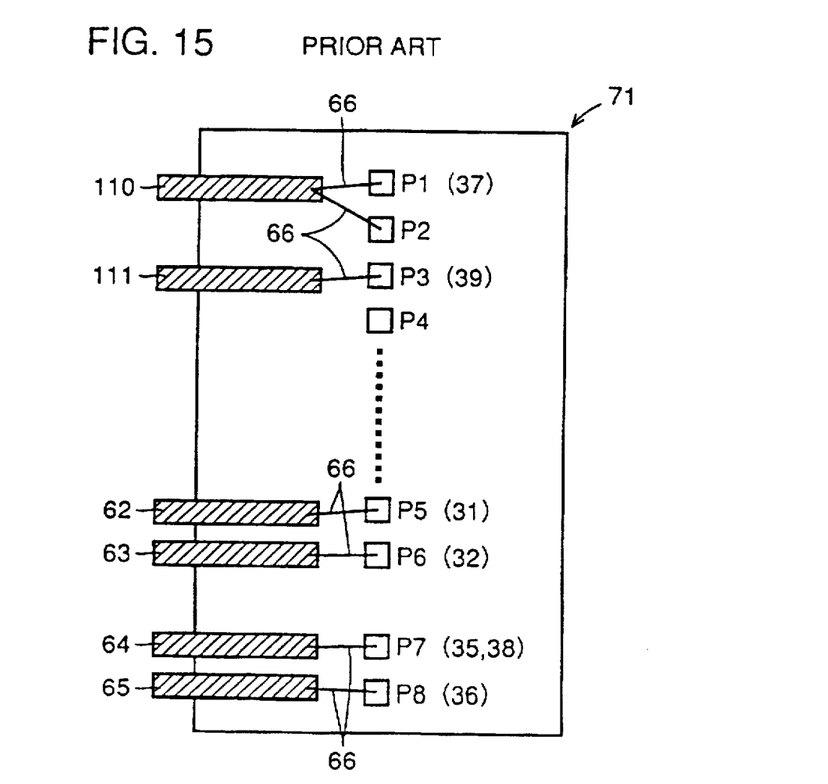
FIG. 15 is a plan view showing a structure of another conventional DRAM chip, wherein illustration of some components is omitted.

Although it is possible to respectively provide lead frames 110 and 111 to pads P1 and P2 and pad P3 as shown in FIG. 15 in order to prevent transmission of power supply noise from pad P3 to pads P1 and P2, this causes increase in the number of pins in the package.

Second, since VDC circuit 59 and buffers 43 to 46 receive an external power supply potential ext•VCC from the same pad P7, buffers 43 to 46 malfunction due to power supply noise of VDC circuit 59, and on the contrary, VDC circuit 59 malfunctions due to power supply noise of buffers 43 to 46.

Third, the external power supply potential ext•VCC line is formed only of the second aluminum interconnection layer (AR2) in FIG. 9, resulting in high interconnection resistance at the external power supply potential ext•VCC line.

Fourth, there exist such cross under portions C and D as shown in FIGS. 11 and 14 in the power supply lines, resulting in high interconnection resistance at the power supply lines.

SUMMARY OF THE INVENTION

It is a primary object of the present invention to provide a semiconductor device which is immune to power supply noise.

It is another object of the present invention to provide a semiconductor device having small interconnection resistance at a power supply line.

According to one aspect of the present invention, tip portions of first and second branch portions branching away from a base end portion of a lead frame is connected to a down-converting circuit and an output circuit, respectively. Therefore, power supply noise of the output circuit flows out to the outside of a chip having lower impedance and will never reach the down-converting circuit through the first branch portion having higher impedance. As a result, a semiconductor device which is immune to power supply noise is implemented.

According to another aspect of the present invention, a down-converting circuit and an input circuit are connected to separate power supply pads. Therefore, it becomes more difficult for power supply noise generated at one circuit to be transmitted to the other as compared to the conventional example in which a down-converting circuit and an input circuit are connected to the same power supply pad. As a result, a semiconductor device which is immune to power supply noise is implemented.

According to a further aspect of the present invention, first to third power supply interconnections are provided above an MOS transistor used as a capacitive element, wherein the second and third power supply interconnections are connected to each other. In addition, power supply voltages are supplied by the second and third power supply interconnection and by the first power supply interconnection. Therefore, interconnection resistance at a power supply interconnection is reduced as compared with the conventional example in which power supply voltages are supplied by only two power supply interconnections.

Preferably, an internal power supply voltage produced at a down-converting circuit is applied between the second and third power supply interconnections and the first power supply interconnection. Therefore, voltage drop between the down-converting circuit and a load circuit can be suppressed and oscillation of the down-converting circuit can be prevented.

According to a still further aspect of the present invention, first and second power supply interconnections for applying an external power supply voltage from first and second power supply pads to an output circuit, respectively, are provided without intersecting each other. Therefore, interconnection resistance at a power supply interconnection is reduced as compared with the conventional example in which first and second power supply interconnections intersect each other.

According to a yet further aspect of the present invention, first and second power supply interconnections for applying an external power supply voltage from first and second power supply pads to an internal power supply potential generating circuit, respectively, are provided without intersecting each other, and a third power supply interconnection for applying an internal power supply potential from the internal power supply potential generating circuit to an internal circuit is provided without intersecting the first and second power supply interconnections. Therefore, interconnection resistance at a power supply interconnection is reduced as compared with the conventional example in which first to third power supply interconnections intersect each other.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

[First Embodiment]

Figure 1:
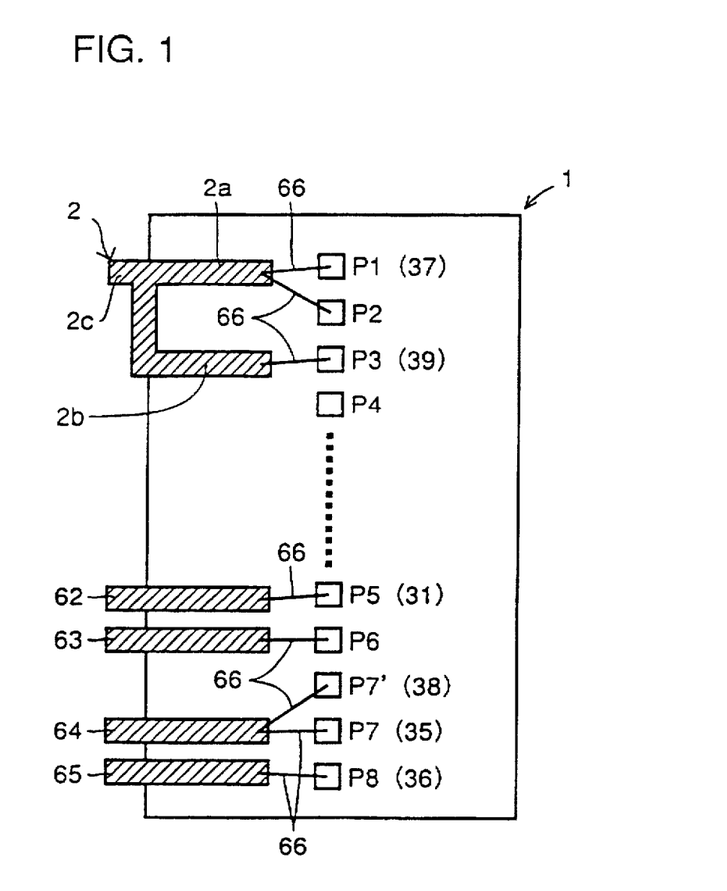
FIG. 1 is a plan view showing a structure of a DRAM in accordance with a first embodiment of the present invention, wherein illustration of some components is omitted.

FIG. 1 is a plan view showing a structure of a DRAM in accordance with a first embodiment of the present invention, wherein illustration of some components is omitted, and is shown in comparison with FIG. 7.

Referring to FIG. 1, this DRAM is different from the conventional DRAM in that a lead frame 61 is replaced with a lead frame 2 and in that a pad P7' is additionally provided at a surface of a chip 1.

Lead frame 2 includes a base end portion 2c and two branch portions 2a and 2b branching away from base end portion 2c. Base end portion 2c is connected to a pin of a package which is not shown. A tip portion of branch portion 2a is connected to pads P1 and P2 through bonding wires 66. A tip portion of branch portion 2b is connected to a pad P3 through a bonding wire 66.

A pad P7 constitutes a power supply terminal 35 for buffers 43 to 46 of FIG. 6, and pad P7' constitutes a power supply terminal 38 for VDC circuit 59 of FIG. 6. A base end portion of a lead frame 64 is connected to a pin of the package which is not shown, and a tip portion thereof is connected to pads P7 and P7' through bonding wires 66. More specifically, buffers 43 to 46 and VDC circuit 59 receive an external power supply potential ext•VCC from separate pads P7 and P7', respectively. An external power supply potential ext•VCC line between pad P7 and buffers 43 to 46, an external power supply potential ext•VCC line between pad P7' and VDC circuit 59, and an external power supply potential ext•VCC line between a pad P8 and VPP circuit 57 are insulated from each other. Since the structure of the DRAM of the present embodiment is otherwise the same as that of the conventional DRAM shown in FIGS. 4 to 6, description thereof will not be repeated herein.

In the present embodiment, since lead frame 2 branches from base end portion 2c, power supply noise generated at output buffer 54 flows to the outside of the chip having lower impedance, and will never reach VDC circuit 58 through branch portion 2a. Therefore, malfunction of the DRAM resulting from power supply noise is prevented during data output.

Furthermore, since buffers 43 to 46 and VDC circuit 59 are respectively connected to separate power supply pads P7 ad P7', it becomes more difficult for power supply noise generated at one circuit to be transmitted to the other as compared with the conventional example in which buffers 43 to 46 and VDC circuit 59 are connected to the same power supply pad P7. Therefore, malfunction of the DRAM resulting from power supply noise is prevented.

Note that although lead frames 2 and 62 to 65 are respectively connected to pads P1 to P8 through bonding wires 66 in the present embodiment, lead frames 2 and 62 to 65 may be directly connected to pads P1 to P8 without bonding wires 66, respectively.

In addition, application of the present invention to a so-called lead-on-chip (LOC) structure in which lead frames 2 and 62 to 65 are arranged on chip 1 is described in the present embodiment, it goes without saying that the same effect can be obtained even if the present invention is applied to a structure other than the lead-on-chip structure.

[Second Embodiment]

Figure 2A:
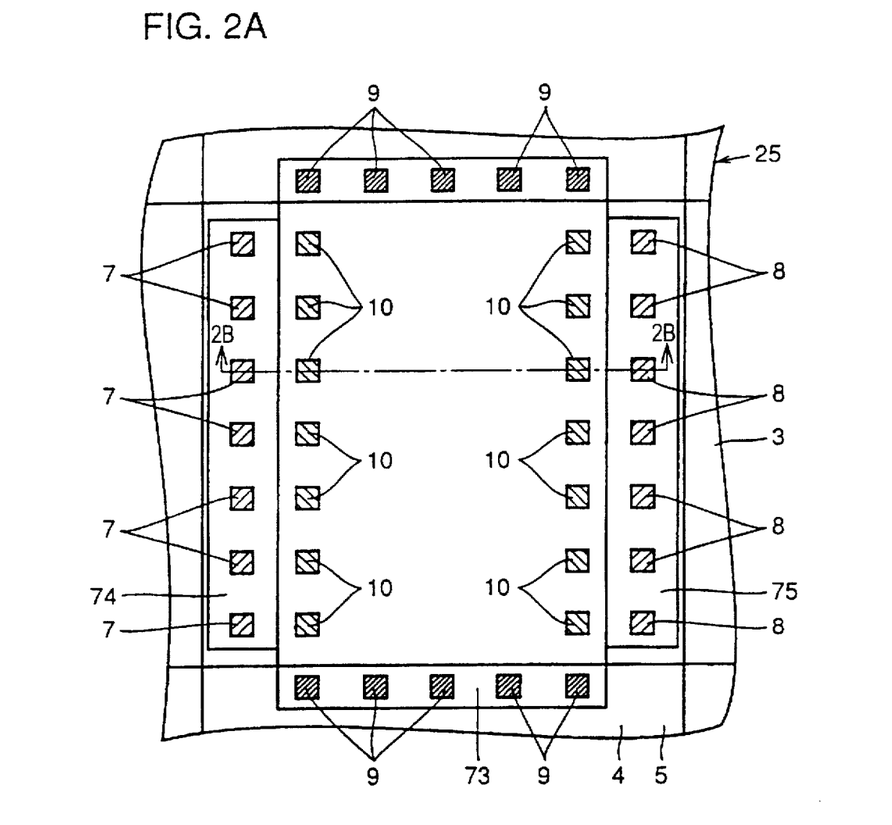
FIG. 2A is a fragmentary plan view showing a structure of a portion including an n channel MOS transistor 70 in a DRAM chip in accordance with a second embodiment of the present invention.
Figure 2B:
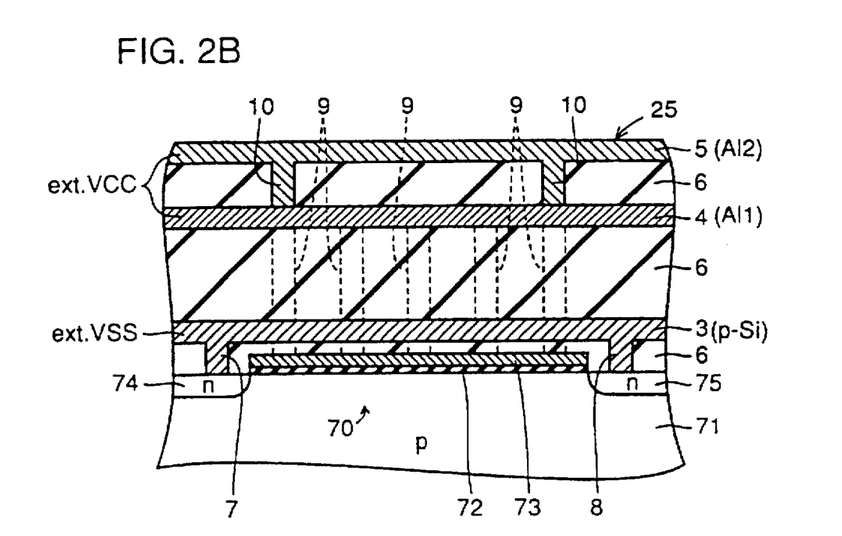
FIG. 2B is a cross sectional view taken along the line 2B—2B of FIG. 2A.

FIG. 2A is a fragmentary plan view showing a structure of a portion including an n channel MOS transistor 70 in a DRAM chip 25 in accordance with a second embodiment of the present invention, and is shown in comparison with FIG. 9A, and FIG. 2B is a cross sectional view taken along the line 2B—2B of FIG. 2A.

Referring to FIGS. 2A and 2B, in this DRAM chip 25, an external ground potential ext•VSS line 3 is formed above an n channel MOS transistor 70 formed at a surface of a silicon substrate 71, with an insulating layer 6 interposed therebetween, an external power supply potential ext•VCC line 4 is further formed above line 3 with insulating layer 6 interposed therebetween, and an external power supply potential ext•VCC line 5 is further formed above line 4 with insulating layer 6 interposed therebetween. External ground potential ext•VSS line 3 is formed of a polysilicon interconnection layer (p-Si), external power supply potential ext•VCC line 4 is of a first aluminum interconnection layer (AR1), and external power supply potential ext•VCC line 5 is of a second aluminum interconnection layer (AR2). External ground potential ext•VSS line 3 is connected to a source region 74 and a drain region 75 of n channel MOS transistor 70 through contact holes 7 and 8, respectively, external power supply potential ext•VCC line 4 is connected to a gate electrode 73 of n channel MOS transistor 70 through a contact hole 9, and external power supply potential ext•VCC line 5 is connected to external power supply potential ext•VCC line 4 through a contact hole 10.

In the present embodiment, since external ground potential ext•VSS line 3 is formed of the polysilicon interconnection layer (p-Si) and external power supply potential ext•VCC lines 4 and 5 are respectively formed of the first and second aluminum interconnection layers (AR1 and AR2), an interconnection resistance value at an external power supply potential ext•VCC line can be reduced as compared with the conventional example in which external ground potential ext•VSS line 76 is formed of the first aluminum interconnection layer (AR1) and external power supply potential ext•VCC line 77 is formed of the second aluminum interconnection layer (AR2). Therefore, voltage drop of an external power supply potential ext•VCC due to interconnection resistance at an external power supply potential ext•VCC line can be suppressed.

[Third Embodiment]

Figure 3:
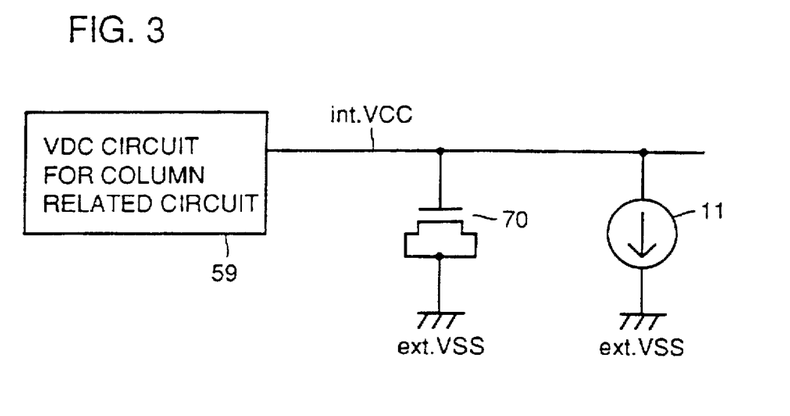
FIG. 3 is a circuit block diagram showing a structure of a main part of a DRAM in accordance with a third embodiment of the present invention.

FIG. 3 is a circuit block diagram showing a main part of a DRAM in accordance with a third embodiment of the present invention.

Referring to FIG. 3, this DRAM includes a VDC circuit 59, a capacitor constituted by an n channel MOS transistor 70, and a load circuit 11. VDC circuit 59 is the same as that shown in FIGS. 6 and 13, and load circuit 11 is a column-related circuit (the portion A in FIG. 6) of FIG. 6. An internal power supply potential int•VCC produced at VDC circuit 59 is applied to load circuit 11 through an internal power supply potential int•VCC line. The capacitor constituted by n channel MOS transistor 70 is provided between the internal power supply potential int•VCC line and an external ground potential ext•VSS line.

The internal power supply potential int•VCC line and the external ground potential ext•VSS line between VDC circuit 59 and load circuit 11 are formed in a manner similar to that of FIGS. 2A and 2B. More specifically, the external ground potential ext•VSS line is formed of a polysilicon interconnection layer (p-Si), and the internal power supply potential int•VCC line is formed of first and second aluminum interconnection layers (AR1 and AR2).

The same effect as that of the second embodiment can be obtained by the present embodiment.

Furthermore, since the capacitor constituted by n channel MOS transistor 70 is provided between the internal power supply potential int•VCC line and the external ground potential ext•VSS line, load at VDC circuit 59 is appropriately increased, so that VDC circuit 59 can be prevented from oscillating.

[Fourth Embodiment]

Figure 4:
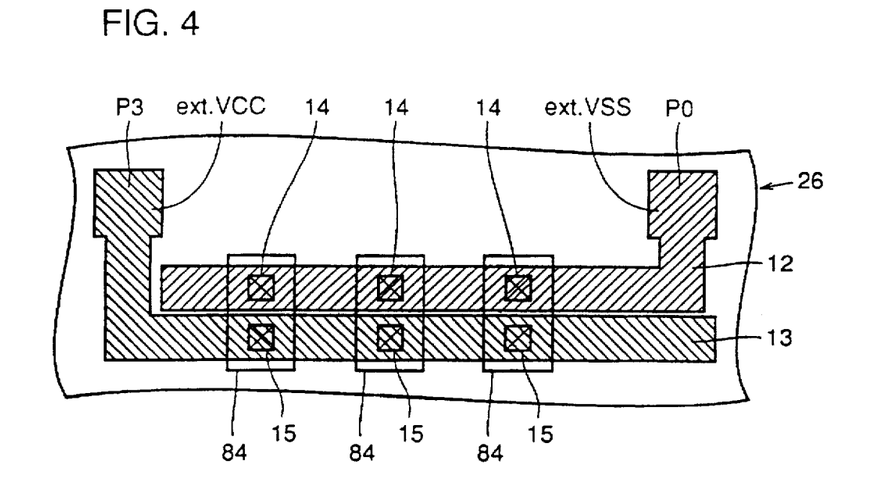
FIG. 4 is a fragmentary plan view showing a structure of a portion including an output circuit 84 in a DRAM chip in accordance with a fourth embodiment of the present invention.

FIG. 4 is a fragmentary plan view showing a structure of a portion including an output circuit 84 in a DRAM chip 26 in accordance with a fourth embodiment of the present invention, and is shown in comparison with FIG. 11.

Referring to FIG. 4, this DRAM chip 26 is different from DRAM chip 60 of FIG. 11 in that DRAM chip 26 has no cross under portion (the portion C in FIG. 11). More specifically, an external ground potential ext•VSS line 12 and an external power supply potential ext•VCC line 13 are arranged in parallel above output circuit 84 provided at a surface of DRAM chip 26. External ground potential ext•VSS line 12 has its one end connected to a pad P0, and external power supply potential ext•VCC line 13 has its one end connected to a pad P3. External ground potential ext•VSS line 12 is connected to output circuit 84 through a contact hole 14, and external power supply potential ext•VCC line 13 is connected to output circuit 84 through a contact hole 15. External ground potential ext•VSS line 12 and external power supply potential ext•VCC line 13 do not intersect each other at all.

In the present embodiment, since external ground potential ext•VSS line 12 and external power supply potential ext•VCC line 13 do not intersect each other at all, interconnection resistance at a power supply line can be reduced as compared with the conventional example in which external ground potential ext•VSS line 91 and external power supply potential ext•VCC line 92 intersect each other.

[Fifth Embodiment]

Figure 5:
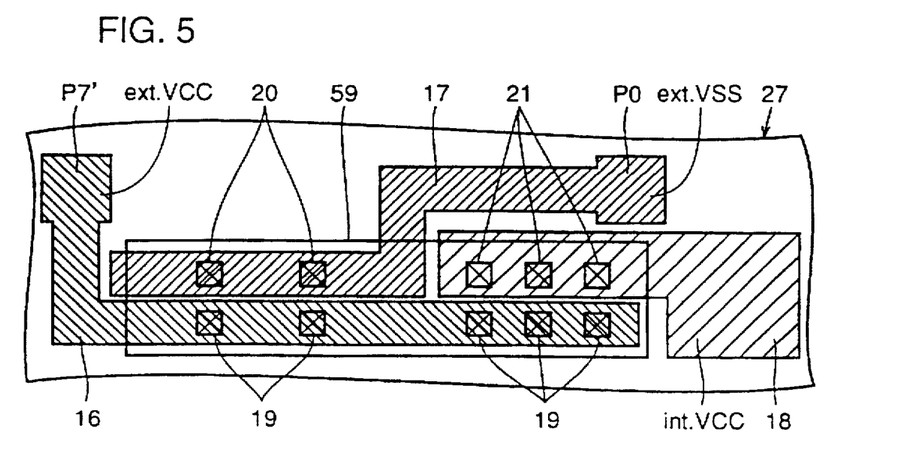
FIG. 5 is a fragmentary plan view showing a structure of a portion including a VDC circuit 59 in a DRAM chip in accordance with a fifth embodiment of the present invention.

FIG. 5 is a fragmentary plan view showing a structure of a portion including a VDC circuit 59 in a DRAM chip 27 in accordance with a fifth embodiment of the present invention, and is shown in comparison with FIG. 14.

Referring to FIG. 5, this DRAM chip 27 is different from DRAM chip 60 of FIG. 14 in that DRAM chip 27 has no cross under portion (the portion D in FIG. 14). More specifically, an external power supply potential ext•VCC line 16, an external ground potential ext•VSS line 17 and an internal power supply potential int•VCC line 18 are located above VDC circuit 59 provided at a surface of DRAM chip 27. External power supply potential ext•VCC line 16 has its one end connected to a pad P7', and external ground potential ext•VSS line 17 has its one end connected to a pad P0. External power supply potential ext•VCC line 16, external ground potential ext•VSS line 17 and internal power supply potential int•VCC line 18 are connected to VDC circuit 59 through respective contact holes 19, 20 and 21. These three lines 16, 17 and 18 do not intersect each other at all.

In the present embodiment, since three lines 16, 17 and 18 do not intersect each other at all, interconnection resistance at a power supply line is reduced as compared with the conventional example in which three lines 100, 101 and 102 intersect each other. Therefore, voltage drop due to interconnection resistance at a power supply line can be suppressed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device having an internal circuit responsive to an external signal for carrying out a predetermined operation, comprising:

first to third power supply pads each receiving an external power supply voltage;

a boosting circuit receiving said external power supply voltage from said first power supply pad for boosting the external power supply voltage to produce a first internal power supply voltage for said internal circuit;

a down-converting circuit receiving said external power supply voltage from said second power supply pad for down-converting the external power supply voltage to produce a second internal power supply voltage for said internal circuit; and an input circuit receiving said external power supply voltage from said third power supply pad for transmitting said external signal to said internal circuit, wherein a line for said external power supply voltage between said first power supply pad and said boosting circuit, a line for said external power supply voltage between said second power supply pad and said down-converting circuit, and a line for said external power supply voltage between said third power supply pad and said input circuit are insulated from each other.

* * * * *